(12) United States Patent
Vadivelmurugan

(10) Patent No.: US 10,497,750 B2
(45) Date of Patent: Dec. 3, 2019

(54) ELECTRONIC MEMORY USING MEMRISTORS AND CROSSBARS ACTIVATING A PLURALITY OF MEMRISTORS IN SERIES

(71) Applicant: Purdue Research Foundation, West Lafayette, IN (US)

(72) Inventor: Selvakumaran Vadivelmurugan, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 15/714,329

(22) Filed: Sep. 25, 2017

(65) Prior Publication Data

US 2018/0247977 A1    Aug. 30, 2018

Related U.S. Application Data

(63) Continuation of application No. 14/720,714, filed on May 22, 2015, now Pat. No. 9,773,843.

(60) Provisional application No. 62/001,695, filed on May 22, 2014.

(51) Int. Cl.
| | |
|---|---|
| *H01L 27/24* | (2006.01) |
| *G11C 13/00* | (2006.01) |
| *H01L 45/00* | (2006.01) |

(52) U.S. Cl.
CPC ...... *H01L 27/2481* (2013.01); *G11C 13/0007* (2013.01); *H01L 45/04* (2013.01); *H01L 45/1233* (2013.01); *H01L 45/146* (2013.01); *G11C 2213/71* (2013.01); *G11C 2213/77* (2013.01)

(58) Field of Classification Search
CPC ... H01L 27/2481; H01L 45/04; H01L 45/146; H01L 45/1233; G11C 13/0007; G11C 2213/77; G11C 2213/71
See application file for complete search history.

(56) References Cited

U.S. PATENT DOCUMENTS

| | | | |
|---|---|---|---|
| 2012/0127779 A1* | 5/2012 | Scheuerlein | G11C 5/02 365/148 |
| 2014/0153314 A1* | 6/2014 | Baker | G11C 13/0002 365/148 |
| 2015/0188043 A1* | 7/2015 | Wang | H01L 45/146 257/4 |

* cited by examiner

*Primary Examiner* — Jerome Leboeuf
(74) *Attorney, Agent, or Firm* — Purdue Research Foundation

(57) ABSTRACT

A memory system comprising a plurality of layers of spaced-apart row electrodes, each having a dorsal and a ventral side, a plurality of layers of spaced-apart column electrodes, each having a dorsal and a ventral side is, and a plurality of layers of spaced-apart memristors arranged so that each of the row electrodes and each of the column electrodes is in contact with at least one memristor on the dorsal side thereof and with at least one memristor on the ventral side thereof.

13 Claims, 8 Drawing Sheets

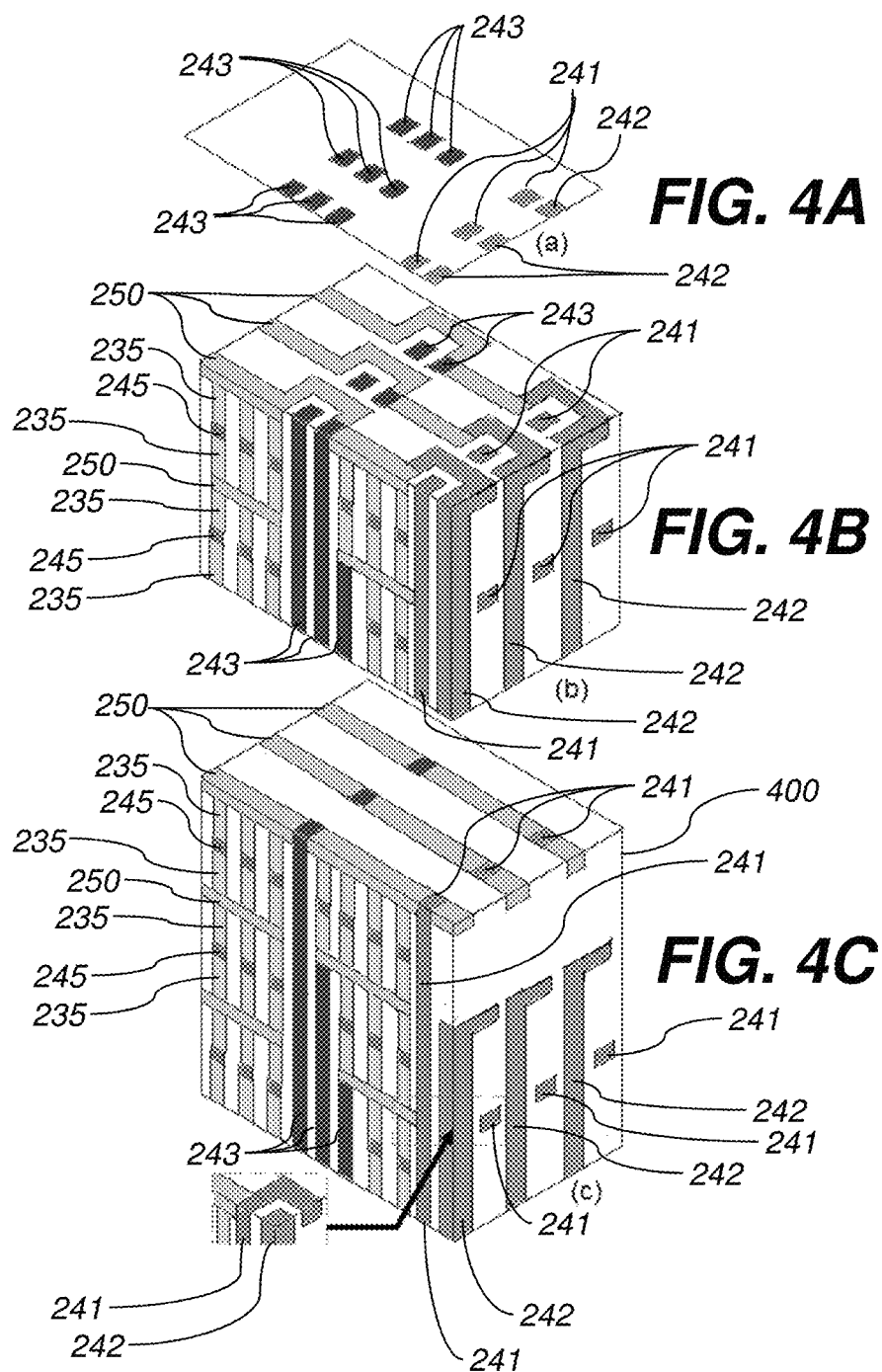

ELECTRONIC MEMORY USING MEMRISTORS AND CROSSBARS ACTIVATING A PLURALITY OF MEMRISTORS IN SERIES

CROSS-REFERENCE TO RELATED APPLICATIONS

The present application is a continuation of U.S. patent application Ser. No. 14/720,714, filed May 22, 2015, which claims the benefit of U.S. provisional application Ser. No. 62/001,695, filed May 22, 2014, the contents of which are hereby incorporated by reference in their entirety.

TECHNICAL FIELD

The present application relates to storage of information in electronic systems, and particularly to such systems using crossbar arrays of storage elements to hold information.

BACKGROUND

There is a need for high bit density in computer memories. There is also a need for high density at low cost. Present high-density schemes are costly. There is, therefore, a need of improved computer memory (storage) devices.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein:

FIG. 4A-4D show steps in a fabrication process of an exemplary inventive memristor crossbar memory according to one embodiment.

The attached drawings are for purposes of illustration and are not necessarily to scale.

DETAILED DESCRIPTION

In the following description, some aspects will be described in terms that would ordinarily be implemented as software programs. Those skilled in the art will readily recognize that the equivalent of such software can also be constructed in hardware, firmware, or micro-code. Because data-manipulation algorithms and systems are well known, the present description will be directed in particular to algorithms and systems forming part of, or cooperating more directly with, systems and methods described herein. Other aspects of such algorithms and systems, and hardware or software for producing and otherwise processing the signals involved therewith, not specifically shown or described herein, are selected from such systems, algorithms, components, and elements known in the art. Given the systems and methods as described herein, software not specifically shown, suggested, or described herein that is useful for implementation of any aspect is conventional and within the ordinary skill in such arts.

In computer memory devices, a higher bit density could help many portable devices, implantable devices and also possibly save cost like on materials used for fabrication. The present disclosure provides a device where the memory density is increased across stacked crossbars. The height/thickness in general is not seen critical on 3D stack memory where each layer is stacked, but with the presently disclosed extrapolated designs, the vertical memory density i.e. height/thickness is comparable to the lateral dimension because of significant increase in vertical memory density. In some cases (like when there is no separate insulation material used to separate each memristor cells), the vertical density is higher than the horizontal i.e. in each stacked crossbar density. So it becomes important to value the vertical height/thickness, especially for applications like smaller portable devices, more choices in physical dimensions for implantable devices and reducing cost as well.

Figure 1:
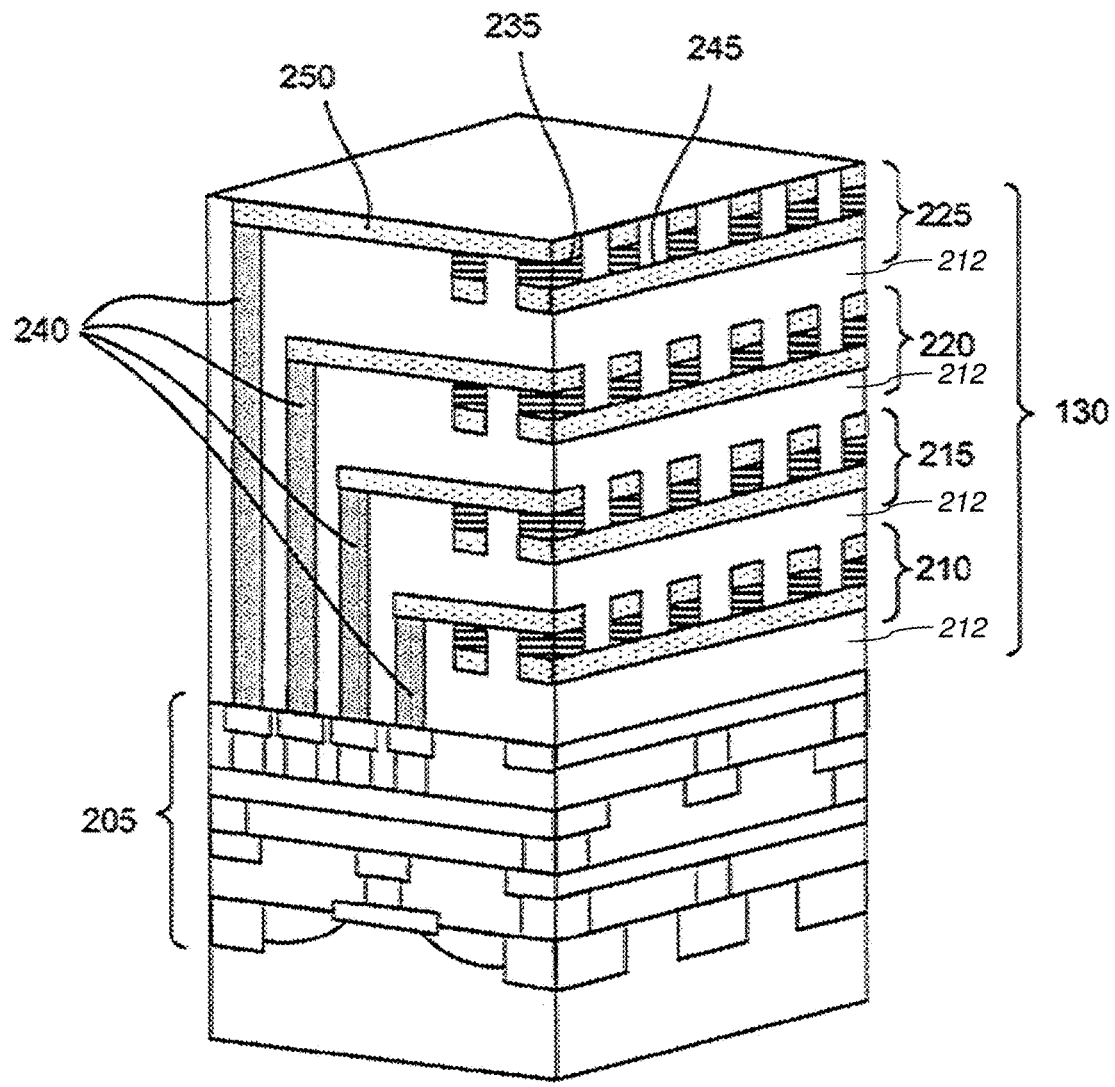
FIG. 1 shows a structure of a comparative memristor crossbar memory.

FIG. 1 shows a comparative prior art embodiment of a memristor array 130. Each layer sandwich 210, 215, 220, 225 has three individual layers: conductive column crossbars 245, conductive row crossbars 250 (with signals provided to the crossbars by control electronics 205 by way of vias 240) and memristors 235. The layer sandwiches are separated by insulator layers 225. A memristor is a device whose electrical resistance is not constant but depends on the history of current that had previously flowed through the device, i.e., its present resistance depends on how much electric charge has flowed in what direction through it in the past. The device remembers its history—the so-called non-volatility property. When the electric power supply is turned off, the memristor remembers its most recent resistance until it is turned on again.

For each layer sandwich, at each crossing stores one bit in a memristor 235. A separate crossbar set (row/column electrode layer pair) is provided for each sandwich, e.g., sandwiches 210 and 215. The thickness (vertical) of the insulator 212 between 210 and 215 can be, e.g., 5 nm. The crossbars can be 30 nm thick; the memristor can be 30 nm thick.

In the present disclosure, $TiO_2$ and oxygen-depleted $TiO_2$ i.e. $TiO_{2-x}$ is considered as the term "memristor layer." In the present disclosure, instead of using an insulating layer and having two separate crossbar layers as in the prior art, each crossbar is shared across two adjacent memristor layers. In other words, a methodology for alternatively selecting memristor layers and a methodology for proper operation is proposed so that it would help increase the vertical density of stacked ReRAM (Resistive Random-access Memory) crossbar arrays. Thus, there is increase in overall density by saving the space of an insulator layer and a crossbar layer and saving cost on related materials. The insulation is created by making use of a dynamic insulator method discuss below. However, there is trade-off on concurrent access, and alternative methods are also proposed to further mitigate the effect of already small tradeoff.

Figure 2:
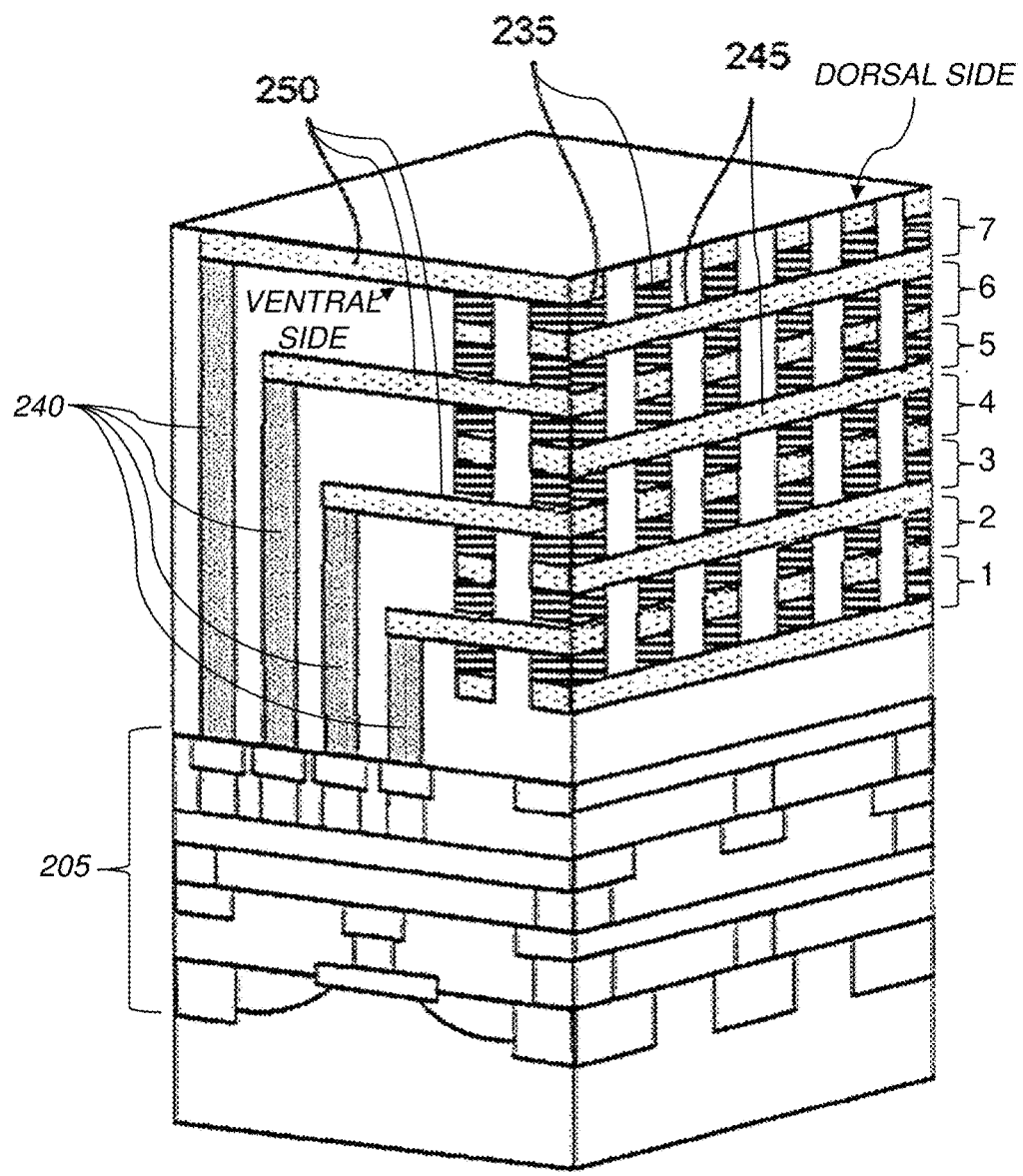
FIG. 2 shows a structure of an exemplary inventive memristor crossbar memory.

FIG. 2 shows an inventive embodiment of the present disclosure in which metal crossbar layers 245, 250 are shared between adjacent sandwiches. Each row or column electrode 245, 250 contacts at least one memristor 235 on each side of that electrode, except for the topmost and bottommost layers. "Top" and "bottom" are not limiting to the orientation of the device. Sharing layers saves, e.g., ~35 nm of height. Therefore for a given thickness of device, more layers, so more bits, can be stored. The side shown facing up in the figure can be referred to as a "dorsal" side, and the side shown facing down in the figure can be referred to as a "ventral" side. The terms "dorsal" and "ventral" do not constrain the device to be oriented any particular way. The inventive device can be fabricated using the same process recipe as the comparative device of FIG. 1, but different masks. The crossbars can be made from any electrically conductive material, including, but not limited to, metal. Also, the memristor and insulator layers/material may be made of any material, of which $TiO_2$ and $TiO_{2-x}$ are nonlimiting examples.

Some prior art 3D stack conventional designs have increased the memory density by, for example, reversing the material order in the memristor for adjacent layers, however, these designs still require the insulator layer across crossbar stacks. Since the proposed design has only the crossbar layers and the memristor cells, it makes the maximum possible memory density for crossbar stacks. There are two key difference between the presently disclosed memory device and the reverse material designs of such prior art devices. First, the reverse material design on adjacent crossbar layers is not a necessity in the design of the present disclosure, material order can be reverse or can be same order for adjacent layers. Second, the need for dynamic insulation during operation is important in the device of the present disclosure. The key advantage of dynamic insulation is the reliability it offers during read and write operations for concurrent access. It is the combination both the design and dynamic insulation makes this proposal a better model.

A conventional 3D memory design has an insulator layer for every crossbar layer stacked. Changes to conventional 3D memory design are needed to allow more crossbars can be stacked for the same space. While still suffering a few short-comings, concurrent access in particular, the inventive design of the present disclosure proves itself as an interesting design alternative because of increase in memory density. For a 2 nm insulator thickness in conventional design, at least 27.50% increase in vertical crossbar density is expected in the proposed design of the present disclosure. A hybrid design between conventional and extrapolated design would give higher concurrency than extrapolated design and higher density than conventional design.

In the comparative prior art example (FIG. 1), each sandwich (210, 215, 220, 225) can be accessed independently. In the inventive example of the present disclosure (FIG. 2), three metal layers are controlled at a time. For example, consider memristor layers numbered 1, 2, . . . 7 going up, as shown. To read or write layer 1, memristors 235 in layers 2-4 are kept below threshold. Therefore the memristors 235 act as resistors in series. The voltage in between memristors 1 and 5 is below the threshold voltage to prevent changing state of the memristors. This permits, e.g., simultaneously accessing layers n, n+3, n+6, . . . for some integer n (in general, n, n+m, n+2m, n+3m, . . . ). The increment m can be 1, 2, 4, . . . (instead of 3) based on the physical characteristics of the memristors being used, and based partly on the metal resistance. E.g., $TiO_2$ contributes some resistance per layer. Nondestructive read is thus possible throughout the array.

When writing, higher voltages are used. The activation of row and column electrodes (crossbars 245, 250) is controlled to provide dynamic insulation across memristors 235 between the active row and column electrodes (crossbars 245, 250); this does not affect memristors in the layers which are not being written. In general, layers n, n+km (integer k) can be written simultaneously.

Figure 4D:
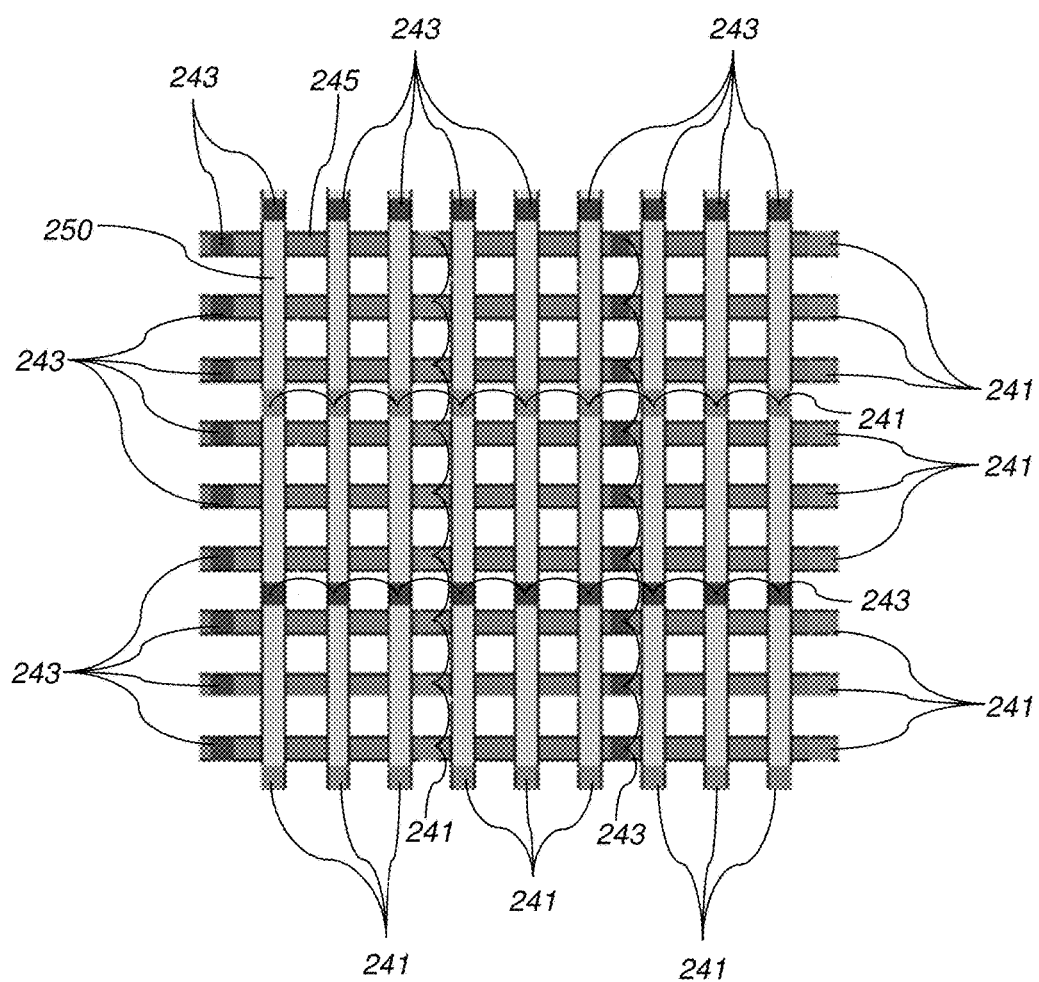

FIGS. 4A-4D illustrate a further embodiment having a zebroid design which permits trading off density and speed. The FIGS. 4A-4D illustrate for a single tile 400, step-by-step, how the electrode cross bars (row crossbars 250, column crossbars 245) are stacked. Similar tiles can be arranged on the dorsal and ventral sides of the tile 400 shown in FIG. 4C. The number of crossbars and interconnects on each tile is not limited to as shown in the FIG. 4C. All of the crossbars 245, 250 and vias 241, 242 and 243 can be made from electrically conductive material, such as metal, as one nonlimiting example. The vias (metal bars) 241, 242, and 243 are similar in material and function to vias 240 described above, but are described here with separate numbering for purposes of explanation. As shown in FIGS. 4A-4D, the row crossbars 250 and column crossbars 245 and their intersection makes a single memristor cell 235. The vias (metal bars) 243 are connected to each stack layer independently whereas the vias (metal bars) 241 are shared across stacked layers. However, the vias 241 can be replaced with independent vias 243 to have more independent control of each stacked layer, but doing so would increase lateral dimension as there would more vias 243. FIG. 4A shows the cross-section at the interface that connects to the buried CMOS. The rectangles 241, 242, 243 are the vias (metal bars). FIG. 4B shows the cross-section on top of one of the crossbar layers. FIG. 4C shows an isometric view at the top most crossbar layer, and an enlarged section 244 of the pattern in another crossbar layer. FIG. 4D shows a top-view of multiple tiles 400 arranged alongside each other.

A single functional unit of stacked crossbars would have vias 243 on two sides and the vias 241 on the other two sides as shown in FIG. 4D. Hence, these vias 243 and 241 are shared with other neighboring functional units as shown in that figure. When accessing one functional unit, it is expected that all other functional units are not turned on. However, other functional units can be turned on such that it does not affect the desired operation of any other functional unit. The voltage in metal bars of these functional units can be compared to resistor networks and hence, controlled accordingly with desired voltages with the help of buried CMOS switches. So to address a memory cell, one needs to know the tile, stacked layer and the memristor cell that needs to be accessed.

Figure 5:
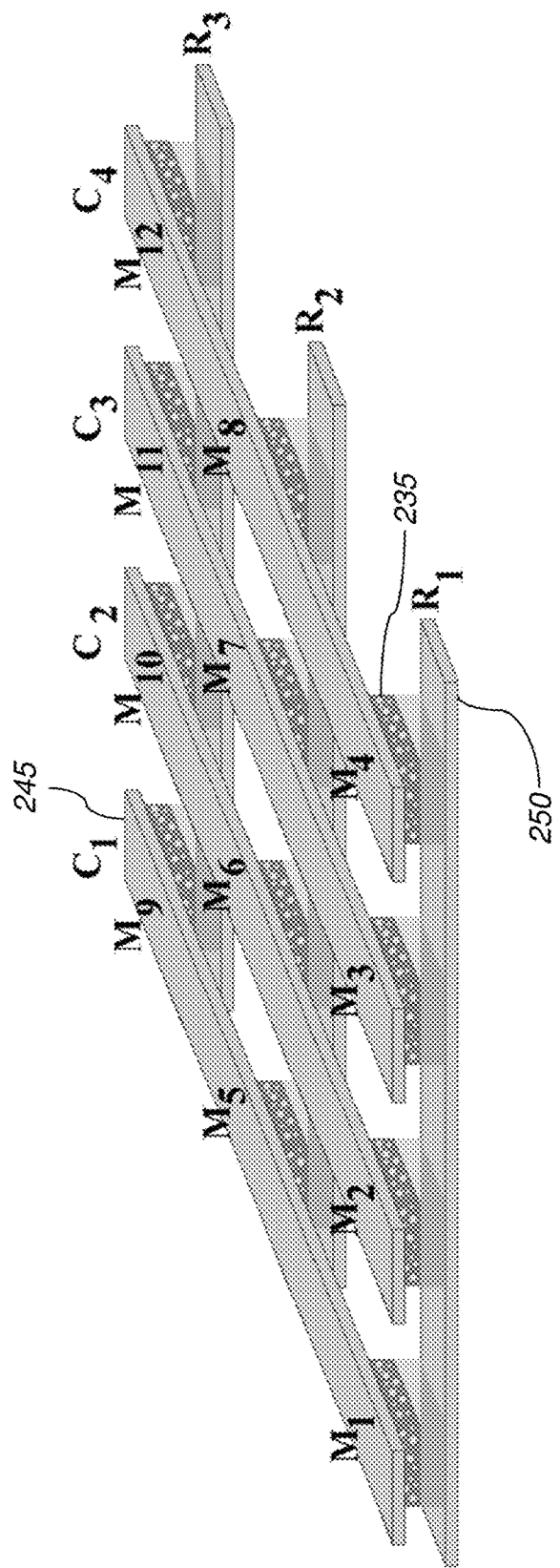
FIG. 5 shows a crossbar structure with twelve memristor cells according to one embodiment.

The following two approaches are intended to increase the speed of read/write access:

Twin Row/Column Access: In a row read/write in a single layer crossbar such as that shown in FIG. 5 (where, C1 to C4 are four column crossbars, R1 to R3 are three row crossbars and M1 to M12 are the twelve memristors), for row R1, memristors M1-4 can be selected by first applying voltage at R1 and grounding or applying voltage across each column C1-C4 each at a time. In a 3D stack of the layers, for a single row selection of R1ii, column layers Ci and Cii can be applied with voltage with one column at a time. Thus, for a single row crossbar selection, two layers of memristors in a 3D stack can be accessed by changing across the column bars.

Figure 6:
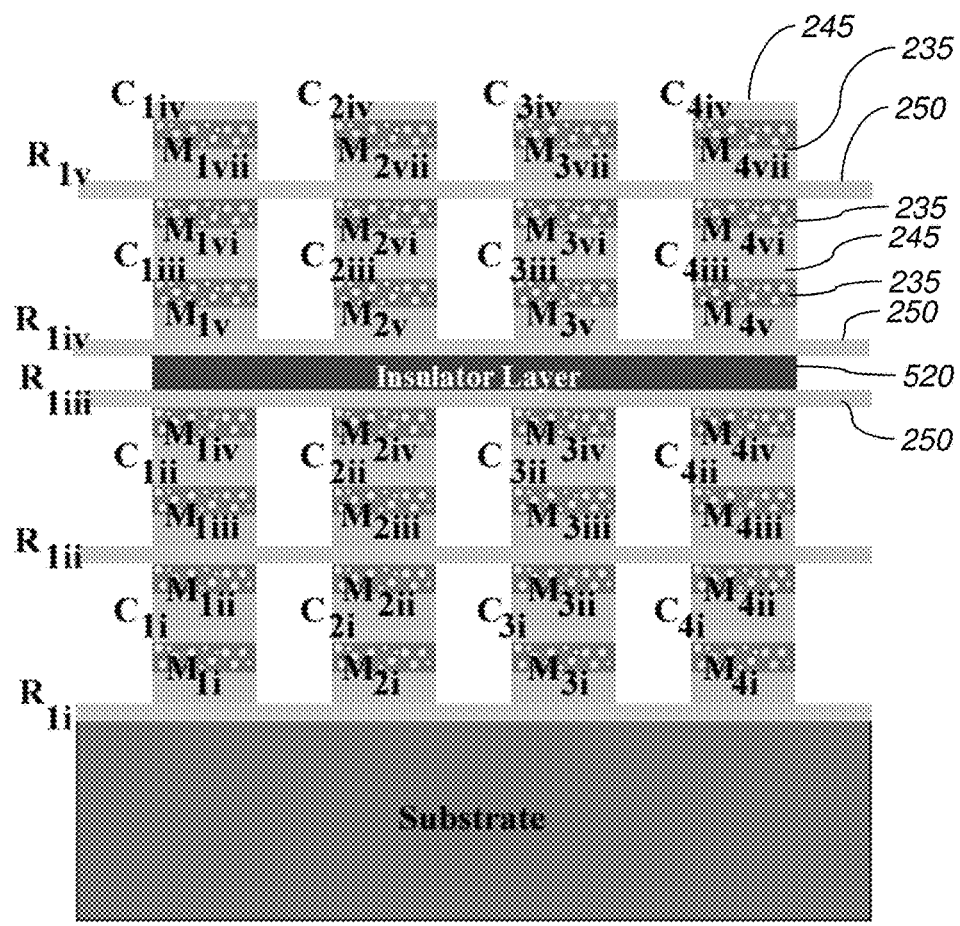
FIG. 6 shows a zebroid crossbar memory according to one embodiment.

The hybrid Zebroid design: In the hybrid design, layers of extrapolated design crossbars are stacked on top of each other and followed by an insulator layer 520 as shown from a front view in FIG. 6. Then again a number of extrapolated layers can be stacked on top of them. This would give a higher density than conventional design and higher concurrency than extrapolated design, whilst lower density than extrapolated design and lower concurrency than conventional design. The number of layers between conventional and extrapolated can be determined according to the application. To keep fabrication steps simple, the insulator layer 520 may be chosen to be only $TiO_2$ but of appropriate larger thickness than other $TiO_2$ layers. It shall be understood that $TiO_2$ is only one example material, and that the insulator or memristor may comprise other suitable materials. In case, the application of RRAM crossbars would be for implantable devices, it is always better to have as many choices as possible, considering need for accurate size and concurrent access.

Simultaneous reading and writing is possible for cells that are laterally, vertically, or in any combination, separated by enough memristors. Each cell has a safe area around it; only one cell in the safe area can be accessed at a time to provide nondestructive reading. In various aspects, only one memristor in a given memristor layer is active at a time.

Bits can be arranged in the array stacked vertically and spaced apart by m so that all the bits in a word can be accessed simultaneously. Other arrangements can also be used.

In an example, to save some switching steps, adjacent memristor layers can be accessed one after the other. By doing this, the electrode in between those two adjacent memristor layers can be left energized or selected when moving the selection from one memristor layer to the other. This can save switching time and reduce power consumption by switches.

Figure 7:
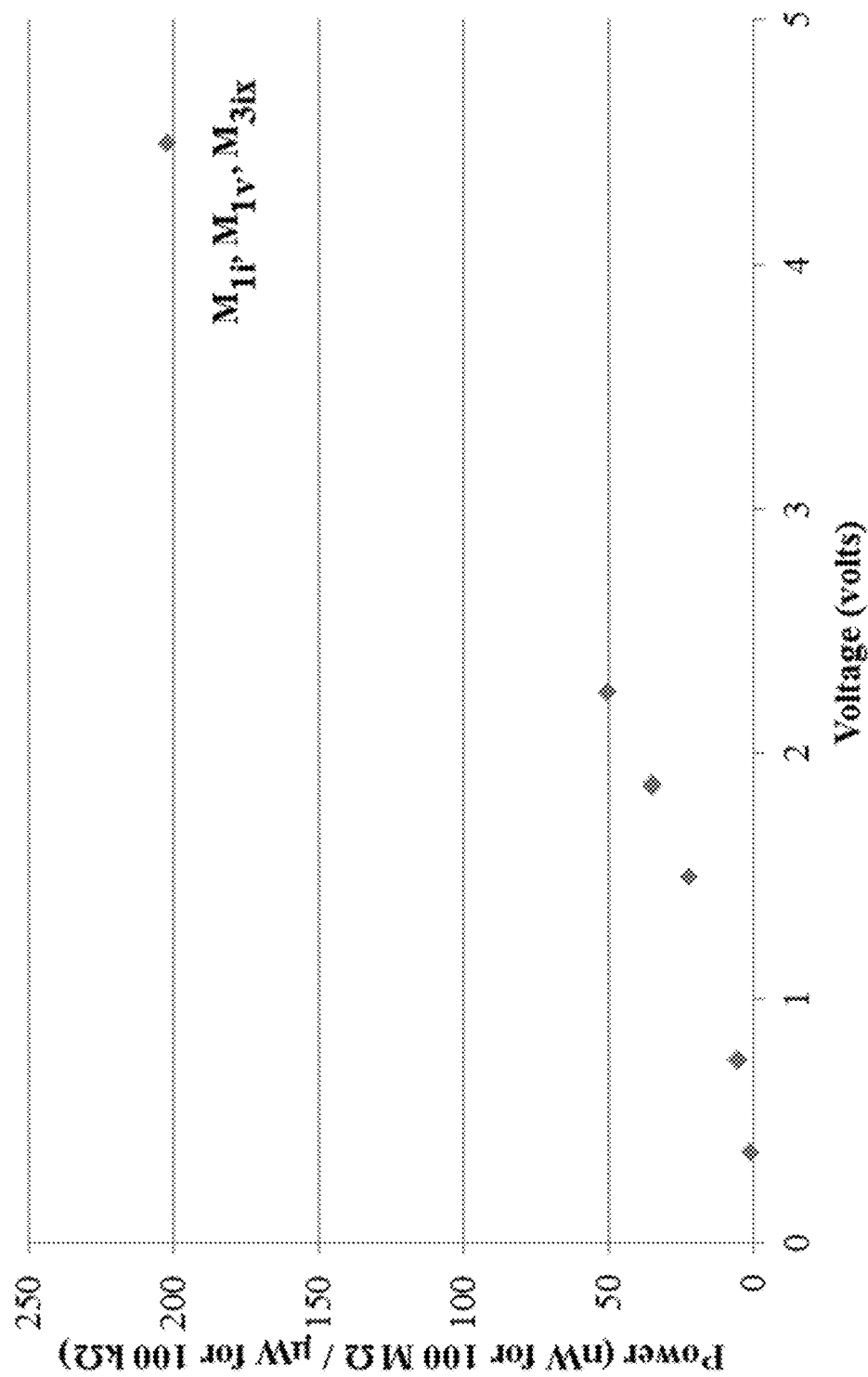
FIG. 7 shows a plot showing magnitude of voltage and power of a sample crossbar memory according to one embodiment.

As shown in FIG. 7, the memristors shown above 3V are those that were simulated. The fact that no other memristors changed state with respect to the threshold indicates that dynamic insulation was present due to the selection of row and column electrodes.

Data can be stored various ways across the crossbar. It is desirable to access related bits concurrently. A trade-off of the new design is the number of concurrent active layers. In the comparative design (FIG. 1), for memory address management and read & write time, consecutive bits can be read by storing them in every adjacent pair of crossbars in sequence and all the crossbar pairs can be active at the same time for reading. In the inventive design (FIG. 2), for memory address management and read & write time, consecutive bits can be read by storing them in every adjacent active crossbar pairs in sequence and all these active crossbar pairs have to be separated by a distance of at least one inactive crossbar pair in between. A crossbar pair is regarded to be inactive when its in-between voltage is less than the threshold voltage that would be needed to change the state of resistance during a write operation.

Various aspects herein provide higher-density computer memory, permitting shrinking the computer memory for a given capacity. Smaller memories permit, e.g., use in implantable devices, which should be as small as possible.

Steps of various methods described herein can be performed in any order except when otherwise specified, or when data from an earlier step is used in a later step. Exemplary method(s) described herein are not limited to being carried out by components particularly identified in discussions of those methods.

In view of the foregoing, various aspects provide improved storage of data. A technical effect is to adjust the physical properties of the memristors by application of electric fields to cause those memristors to hold data. A further technical effect of various aspects is to adjust only selected memristors in an array such as that of FIG. 2, while leaving others undisturbed; this can be done by selecting rows and columns so that the corresponding memristors will obey spacing constraints as noted herein for dynamic insulators. Such selection can be performed, e.g., using coverage algorithms, dynamic programming, or interference graphs.

Figure 3:
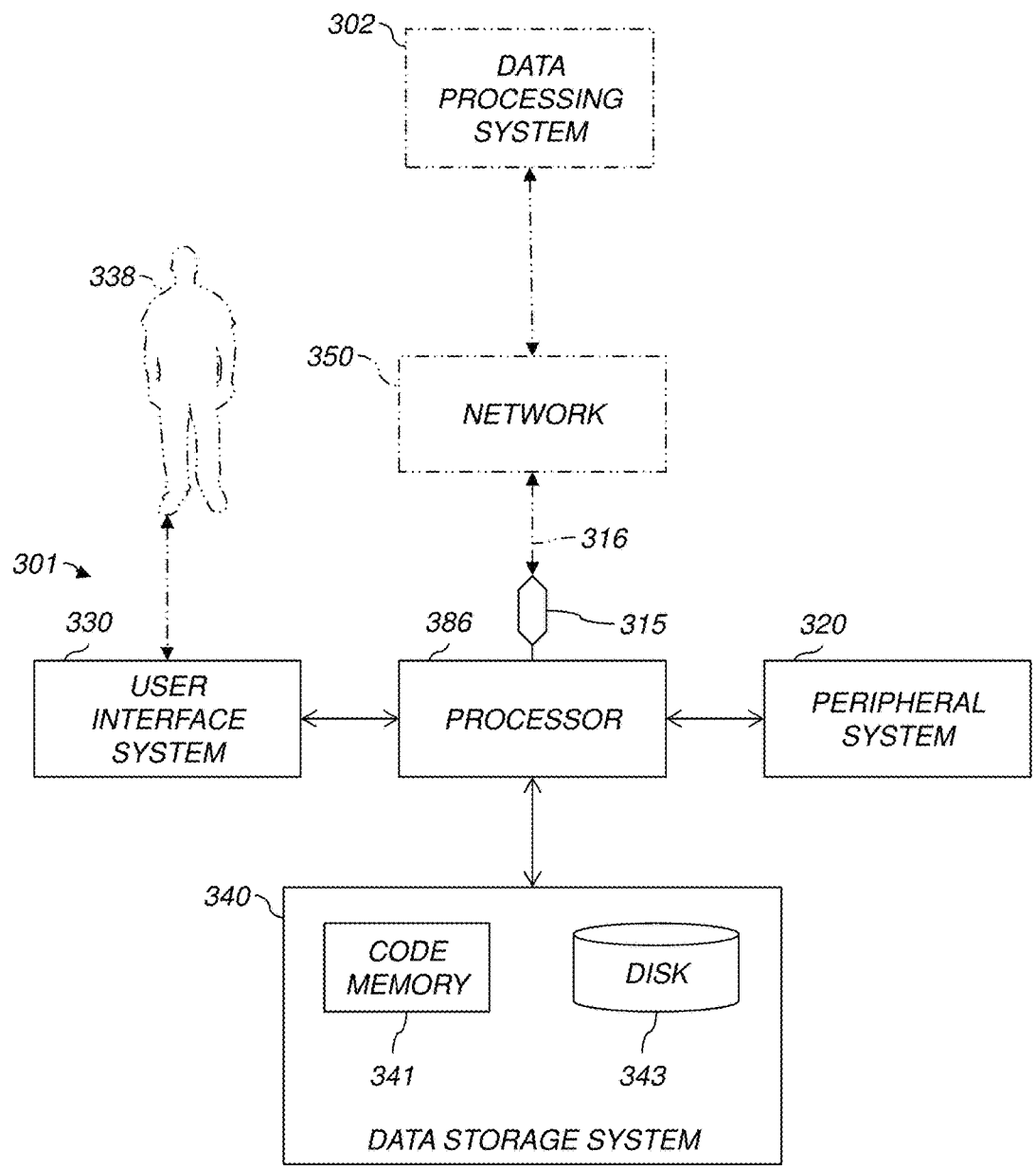
FIG. 3 is a high-level diagram showing the components of a data-processing system.

FIG. 3 is a high-level diagram showing the components of an exemplary data-processing system 301 for analyzing data and performing other analyses described herein, and related components. The system 301 includes a processor 386, a peripheral system 320, a user interface system 330, and a data storage system 340. The peripheral system 320, the user interface system 330 and the data storage system 340 are communicatively connected to the processor 386. Processor 386 can be communicatively connected to network 350 (shown in phantom), e.g., the Internet or a leased line, as discussed below. Computing devices implementing methods described herein, or including memories such as that shown in FIG. 2, can each include one or more of systems 386, 320, 330, 340, and can each connect to one or more network(s) 350. Processor 386, and other processing devices described herein, can each include one or more microprocessors, microcontrollers, field-programmable gate arrays (FPGAs), application-specific integrated circuits (ASICs), programmable logic devices (PLDs), programmable logic arrays (PLAs), programmable array logic devices (PALs), or digital signal processors (DSPs).

Processor 386 can implement processes of various aspects described herein. Processor 386 and related components can, e.g., carry out processes for determining which row electrodes and which column electrodes to activate simultaneously so that selected memristors are written and non-selected memristors participate in dynamic insulators so that only the values of the selected memristors change.

Processor 386 can be or include one or more device(s) for automatically operating on data, e.g., a central processing unit (CPU), microcontroller (MCU), desktop computer, laptop computer, mainframe computer, personal digital assistant, digital camera, cellular phone, smartphone, or any other device for processing data, managing data, or handling data, whether implemented with electrical, magnetic, optical, biological components, or otherwise. Processor 386 can include Harvard-architecture components, modified-Harvard-architecture components, or Von-Neumann-architecture components.

The phrase "communicatively connected" includes any type of connection, wired or wireless, for communicating data between devices or processors. These devices or processors can be located in physical proximity or not. For example, subsystems such as peripheral system 320, user interface system 330, and data storage system 340 are shown separately from the data processing system 386 but can be stored completely or partially within the data processing system 386.

The peripheral system 320 can include one or more devices configured to provide digital content records to the processor 386. For example, the peripheral system 320 can include digital still cameras, digital video cameras, cellular phones, or other data processors. The processor 386, upon receipt of digital content records from a device in the peripheral system 320, can store such digital content records in the data storage system 340.

The user interface system 330 can convey information in either direction, or in both directions, between a user 338 and the processor 386 or other components of system 301. The user interface system 330 can include a mouse, a keyboard, another computer (connected, e.g., via a network or a null-modem cable), or any device or combination of devices from which data is input to the processor 386. The user interface system 330 also can include a display device, a processor-accessible memory, or any device or combination of devices to which data is output by the processor 386. The user interface system 330 and the data storage system 340 can share a processor-accessible memory.

In various aspects, processor 386 includes or is connected to communication interface 315 that is coupled via network link 316 (shown in phantom) to network 350. For example, communication interface 315 can include an integrated services digital network (ISDN) terminal adapter or a modem to communicate data via a telephone line; a network interface to communicate data via a local-area network (LAN), e.g., an Ethernet LAN, or wide-area network (WAN); or a radio to communicate data via a wireless link, e.g., WiFi or GSM. Communication interface 315 sends and receives electrical, electromagnetic or optical signals that carry digital or analog data streams representing various types of information across network link 316 to network 350. Network link 316 can be connected to network 350 via a switch, gateway, hub, router, or other networking device.

In various aspects, system 301 can communicate, e.g., via network 350, with a data processing system 302, which can include the same types of components as system 301 but is not required to be identical thereto. Systems 301, 302 are communicatively connected via the network 350.

Processor 386 can send messages and receive data, including program code, through network 350, network link 316 and communication interface 315. For example, a server can store requested code for an application program (e.g., a JAVA applet) on a tangible non-volatile computer-readable storage medium to which it is connected. The server can retrieve the code from the medium and transmit it through network 350 to communication interface 315. The received code can be executed by processor 386 as it is received, or stored in data storage system 340 for later execution.

Data storage system 340 can include or be communicatively connected with one or more processor-accessible memories configured to store information. The memories can be, e.g., within a chassis or as parts of a distributed system. The phrase "processor-accessible memory" is intended to include any data storage device to or from which processor 386 can transfer data (using appropriate components of peripheral system 320), whether volatile or non-volatile; removable or fixed; electronic, magnetic, optical, chemical, mechanical, or otherwise. Exemplary processor-accessible memories include but are not limited to: registers, floppy disks, hard disks, tapes, bar codes, Compact Discs, DVDs, read-only memories (ROM), erasable programmable read-only memories (EPROM, EEPROM, or Flash), and random-access memories (RAMs). One of the processor-accessible memories in the data storage system 340 can be a tangible non-transitory computer-readable storage medium, i.e., a non-transitory device or article of manufacture that participates in storing instructions that can be provided to processor 386 for execution. Data storage system 340 can include one or more conventional (FIG. 1), inventive (FIG. 2), or zebroid (FIGS. 4A-4D) memories, in any combination, each memory having any number of layers.

In an example, data storage system 340 includes code memory 341, e.g., a RAM, and disk 343, e.g., a tangible computer-readable rotational storage device such as a hard drive. Computer program instructions are read into code memory 341 from disk 343. Processor 386 then executes one or more sequences of the computer program instructions loaded into code memory 341, as a result performing process steps described herein. In this way, processor 386 carries out a computer implemented process. For example, steps of methods described herein, blocks of the flowchart illustrations or block diagrams herein, and combinations of those, can be implemented by computer program instructions. Code memory 341 can also store data, or can store only code.

Various aspects described herein may be embodied as systems or methods. Accordingly, various aspects herein may take the form of an entirely hardware aspect, an entirely software aspect (including firmware, resident software, micro-code, etc.), or an aspect combining software and hardware aspects These aspects can all generally be referred to herein as a "service," "circuit," "circuitry," "module," or "system."

Furthermore, various aspects herein may be embodied as computer program products including computer readable program code stored on a tangible non-transitory computer readable medium. Such a medium can be manufactured as is conventional for such articles, e.g., by pressing a CD-ROM. The program code includes computer program instructions that can be loaded into processor 386 (and possibly also other processors), to cause functions, acts, or operational steps of various aspects herein to be performed by the processor 386 (or other processor). Computer program code for carrying out operations for various aspects described herein may be written in any combination of one or more programming language(s), and can be loaded from disk 343 into code memory 341 for execution. The program code may execute, e.g., entirely on processor 386, partly on processor 386 and partly on a remote computer connected to network 350, or entirely on the remote computer.

The invention is inclusive of combinations of the aspects described herein. References to "a particular aspect" and the like refer to features that are present in at least one aspect of the invention. Separate references to "an aspect" (or "embodiment") or "particular aspects" or the like do not necessarily refer to the same aspect or aspects; however, such aspects are not mutually exclusive, unless so indicated or as are readily apparent to one of skill in the art. The use of singular or plural in referring to "method" or "methods" and the like is not limiting. The word "or" is used in this disclosure in a non-exclusive sense, unless otherwise explicitly noted.

The invention has been described in detail with particular reference to certain preferred aspects thereof, but it will be understood that variations, combinations, and modifications can be effected by a person of ordinary skill in the art within the spirit and scope of the invention.

The invention claimed is:

1. A memory system, comprising:
 a) a plurality of layers of spaced-apart row electrodes, each having a dorsal and a ventral side;
 b) a plurality of layers of spaced-apart column electrodes, each having a dorsal and a ventral side;
 c) a plurality of layers of spaced-apart memristors arranged so that each of the row electrodes and each of the column electrodes are in contact with at least one memristor on the dorsal side thereof and with at least one memristor on the ventral side thereof; and
 a controller configured to concurrently activate one(s) of the row electrodes and one(s) of the column electrodes, so that selected memristors either:
 a) are in contact with both an activated row electrode and an activated column electrode; or
 b) are in a series connection between an activated row electrode and an activated column electrode, the series connection including at least one other of the memristors;

wherein there is an additional row or column electrode between the selected memristors and at least one other of the memristors.

2. The system according to claim 1, further including a top layer of either row electrodes or column electrodes and a bottom layer of either row electrodes or column electrodes, wherein the dorsal side of electrodes in the top layer is not in contact with memristors and the ventral side of electrodes in the top layer is in contact with memristors; and wherein the dorsal side of electrodes in the bottom layer is in contact with memristors and the ventral side of electrodes in the bottom layer is not in contact with memristors.

3. The system of according to claim 1, comprising:
at least a first memory section having a plurality of said layers of spaced-apart row electrodes, spaced-apart column electrodes, and said spaced-apart memristors; and
a second memory section having a plurality of said layers of spaced-apart row electrodes, spaced-apart column electrodes, and said spaced-apart memristors, said first memory section separated from said second memory section by an insulator layer.

4. The system according to claim 1, wherein the plurality of layers are grouped in a tiled manner.

5. The system according to claim 1, wherein the system is fabricated using a CMOS process.

6. The system according to claim 1, wherein the memristors comprise $TiO_2$.

7. The system according to claim 6, wherein the memristors comprise $TiO_{2-x}$.

8. The system according to claim 1, wherein the row electrodes and column electrodes comprise metal.

9. The system of according to claim 2, comprising:
at least a first memory section having a plurality of said layers of spaced-apart row electrodes, spaced-apart column electrodes, and said spaced-apart memristors; and
a second memory section having a plurality of said layers of spaced-apart row electrodes, spaced-apart column electrodes, and said spaced-apart memristors, said first memory section separated from said second memory section by an insulator layer.

10. The system according to claim 9, wherein the memristors comprise $TiO_2$.

11. The system according to claim 10, wherein the memristors comprise $TiO_{2-x}$.

12. The system according to claim 11, wherein the row crossbars and column crossbars comprise metal.

13. The system according to claim 12, wherein the plurality of layers are grouped in a tiled manner.

* * * * *